(12) United States Patent
Salvatore

(10) Patent No.: US 6,356,513 B1
(45) Date of Patent: Mar. 12, 2002

(54) ADDITIONAL PROBE CIRCUIT FOR MEASURING DELAY TIME IN EMBEDDED CIRCUITS

(75) Inventor: Elia Salvatore, Cavenago di Brianza (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/322,554

(22) Filed: May 28, 1999

(30) Foreign Application Priority Data

May 29, 1998 (IT) .......................... TO98A0467

(51) Int. Cl.[7] .......................... G04F 8/00; G10R 15/12; G06F 11/14
(52) U.S. Cl. .......................... 368/113; 324/73.1
(58) Field of Search .......................... 368/113–120; 324/73.1, 158.1, 760, 765; 371/15.1, 22.5, 22.6, 25, 27; 714/724, 733, 734

(56) References Cited

U.S. PATENT DOCUMENTS

| | | | | |
|---|---|---|---|---|
| 4,866,685 A | * | 9/1989 | Lee | 368/117 |
| 4,878,209 A | * | 10/1989 | Bassett et al. | 368/113 |
| 5,058,087 A | * | 10/1991 | Welzhofer et al. | 368/113 |
| 5,614,818 A | * | 3/1997 | El Ayat | 324/158.1 |

* cited by examiner

*Primary Examiner*—Vit Miska
(74) *Attorney, Agent, or Firm*—Lisa K. Jorgenson; Stephen Bongini; Fleit, Kain, Gibbons, Gutman & Bongini P.L.

(57) ABSTRACT

Dummy cell test circuit for measuring delay times in embedded, said embedded circuits being connected to access circuits equipped with input access pads and output access pads, between which is comprised an electrical main path, said test circuit comprising a test input pad and a test output pad, between which is comprised an electrical dummy test path. According to the present invention the test input pad correspond to the access input pad (IN1' IN1") of the embedded circuit (2).

17 Claims, 3 Drawing Sheets

US 6,356,513 B1

ADDITIONAL PROBE CIRCUIT FOR MEASURING DELAY TIME IN EMBEDDED CIRCUITS

DESCRIPTION

The present invention concerns a dummy cell test circuit for measuring delay times in embedded circuits, said embedded circuits being connected to access circuits equipped with input access pads and output access pads, between which is comprised an electrical main path, said test circuit comprising a test input pad and a test output pad, between which is comprised an electrical dummy test path.

A circuit having no direct access, also known as 'embedded' circuit, is a circuit, in particular a semiconductor memory located on an integrated chip, whose configuration is arranged so as to be surrounded by further circuitry; in such a situation, said embedded circuit has no direct access from any inputs and outputs of the integrated chip without passing through said further circuitry.

In order to test embedded circuits, in particular memory arrays as referred to later for simplicity's sake, it is known to have test chips so modified to allow their testing, which have input and output pads of the circuits to be tested equipped with buffer circuits, and said pads are accessible from outside by suitable pads for use with the so-called 'probe-cards' of the integrated circuit test machines. Thus, memory test operation will be easier, but the ad-hoc introduced buffer circuits generate signal propagation delays, causing a serious hindrance for determining the real propagation times of the memory under test. EBT (Electron Beam Test) test machines are known, which use electronic beams to stimulate signals in the interconnects and measure delays. However, said EBT test machines are extremely complex and expensive.

In order to solve this drawback in a more cost-effective way it is known to use dummy cell test circuits.

FIG. 1 shows a partial diagram of an integrated circuit 1, comprising a memory 2, which has a clock input ICK and an output Q.

The clock input ICK is connected upstream through an input buffer circuit A1 to an input pad IN1, which is apt to receive a clock signal CK. In reality, the buffer circuit A1 is representative of a buffer cascade.

A selection block 3 is then provided downstream the memory 2, which may be obtained for distance through a multiplexer circuit.

Output Q of the memory 2 is selected through an external selection signal SEL injected on a selection pad SP and available on an external output pad OUT through an output buffer circuit B, which also consists of a buffer or inverters cascade.

The path of the clock signal CK from the input pad IN1 to the output pad OUT forms a main path P1, which is considered to determine the memory propagation delays referred to the active edge of the clock signal CK.

However, since also the input buffer circuit A1, the selection block 3 and the output buffer circuit B belong to the main path P1, said circuits introduce additional delays with respect to those introduced by the memory 2 between the input ICK and output Q. Since the measurement takes place between the input pad IN1 and output pad OUT, so that dummy delays are summed to memory delays, a second input pad IN2 is provided followed by an input buffer circuit A2 repeating the input buffer circuit A1 and connected to the selection block 3, so as to obtain a dummy path P2 further comprising the output buffer circuit B and output pad OUT. The dummy path P2 in conjunction with the selection pad SP forms a test circuit 4. Selecting the dummy path P2 through the selection signal SEL, propagation time values now detected on the output pad OUT are used to subtract them from the values measured for the main path P1 and obtain as a final result the real delay introduced by the memory between the input ICK and output Q.

However, the test circuit 4 represented in FIG. 1 has several drawbacks, since in the practice it is extremely difficult to obtain a dummy path P2 mirroring the main path P1, particularly due to difficulties in obtaining circuitry interconnects. As a result, capacitive loads distributed along the circuitry interconnects are different ones, the same as their deriving propagation delays. Therefore, the difference of propagation times measured on the main path P1 and dummy path P2 do not supply a proper safe propagation times value of the memory under test.

Moreover, sizing of input buffer circuits is particularly difficult, since not only it should be tried to obtain circuits introducing the same capacity effects, but at the same time it must also be attempted to obtain circuits with a driving capacity suitable for driving the capacities available downstream, which are also different, as mentioned above. As a result, such a number of project variables makes it extremely difficult to obtain an efficient sizing of the input circuits and correct evaluation of delays times.

According to the American patent U.S. Pat. No. 4,878, 209, a pulse signal is sent to an input for selecting memory operational modes and transmit a test signal to a further test input. Said signals operate on output buffers at the memory and on a proper test buffer. In particular, two outputs are available, one for the data from the memory and the other for the output test signal; using the test signal for enabling the memory output will operate the circuit allowing an exact measurement of the propagation delay.

The solution described in the above patent has a rather complex actuation, since it requires sending a special test signal as well as a complicated timing control of the signals inside the chip. In this instance, both the dummy path and main path as defined with reference to FIG. 1 will interact and require complex test machines for a result. Furthermore, only the slower memory output can be measured, i.e. not all memory outputs.

It is the object of the present invention to solve the above drawbacks and provide a dummy cell test circuit for measuring delay times in embedded circuits, having a more efficient and improved performance.

In this frame, it is the main object of the present invention to provide a dummy cell test circuit for measuring delay times in embedded circuits, which is not subject to capacity differences with respect to the main path.

A further object of the present invention is to provide a dummy cell test circuit for measuring delay times in embedded circuits, which simplifies input buffer circuits design.

A further object of the present invention is to provide a dummy cell test circuit for measuring delay times in embedded circuits, resulting in a low circuitry complexity and cost-effective manufacture.

A further object of the present invention is to provide a dummy cell test circuit for measuring delay times in embedded circuits, which does not require additional input pads nor external selection signals.

A further object of the present invention is to provide a dummy cell test circuit for measuring delay times in embedded circuits, which makes all embedded circuit outputs accessible for test operations.

In order to achieve such aims, it is the object of the present invention to provide a dummy cell test circuit for measuring delay times in embedded circuits, incorporating the features of the annexed claims, which form an integral part of the description herein.

Further objects, features and advantages of the present invention will become apparent from the following detailed description and annexed drawings, which are supplied by way of non limiting example, wherein:

FIG. 2 shows a partial diagram of an integrated circuit 1' having a test circuit 4' according to the present invention.

A main path P1' comprises:

the input pad IN1', apt to receive the clock signal CK;

an input buffer circuit A', connected downstream the input pad IN1';

the memory 2, with the clock input ICK connected to the output of the input buffer circuit A';

an output buffer circuit B1' connected to the output Q of the memory 2;

an output pad OUT' connected to the output of the output buffer circuit B1'.

Moreover, the input of a second output buffer circuit B2' is connected to the clock input ICK of the memory 2, identical to the output buffer circuit B1', followed by a test output pad OUTT. Said circuitry elements, along with the input buffer circuit A' and input pad IN1' form a dummy path P2'.

The dummy path P2' corresponds to the dummy test path 4' according to the present invention.

The dummy path P2' shares the same input buffer circuit A', uses an output buffer circuit B2' identical to that of the main path P1' and is parallel to the memory 2, so that the delay time introduced by the memory 2 is obtained calculating the difference of the delay times measured on the output pad OUT' and test output pad OUTT.

In order to obtain a good operation the input buffer circuit A' needs to have an adequate driving capacity for maintaining a fast enough signal edge at the clock input CK. Moreover, both output buffer circuits B1' and B2' should appropriately be as close as possible in the space, so that to have the spatial distance for the main path P1' and main path P2' as much equal as possible. Output buffer circuits B1' and B2' may be simply obtained through one or more inverter circuits.

Figure 1:
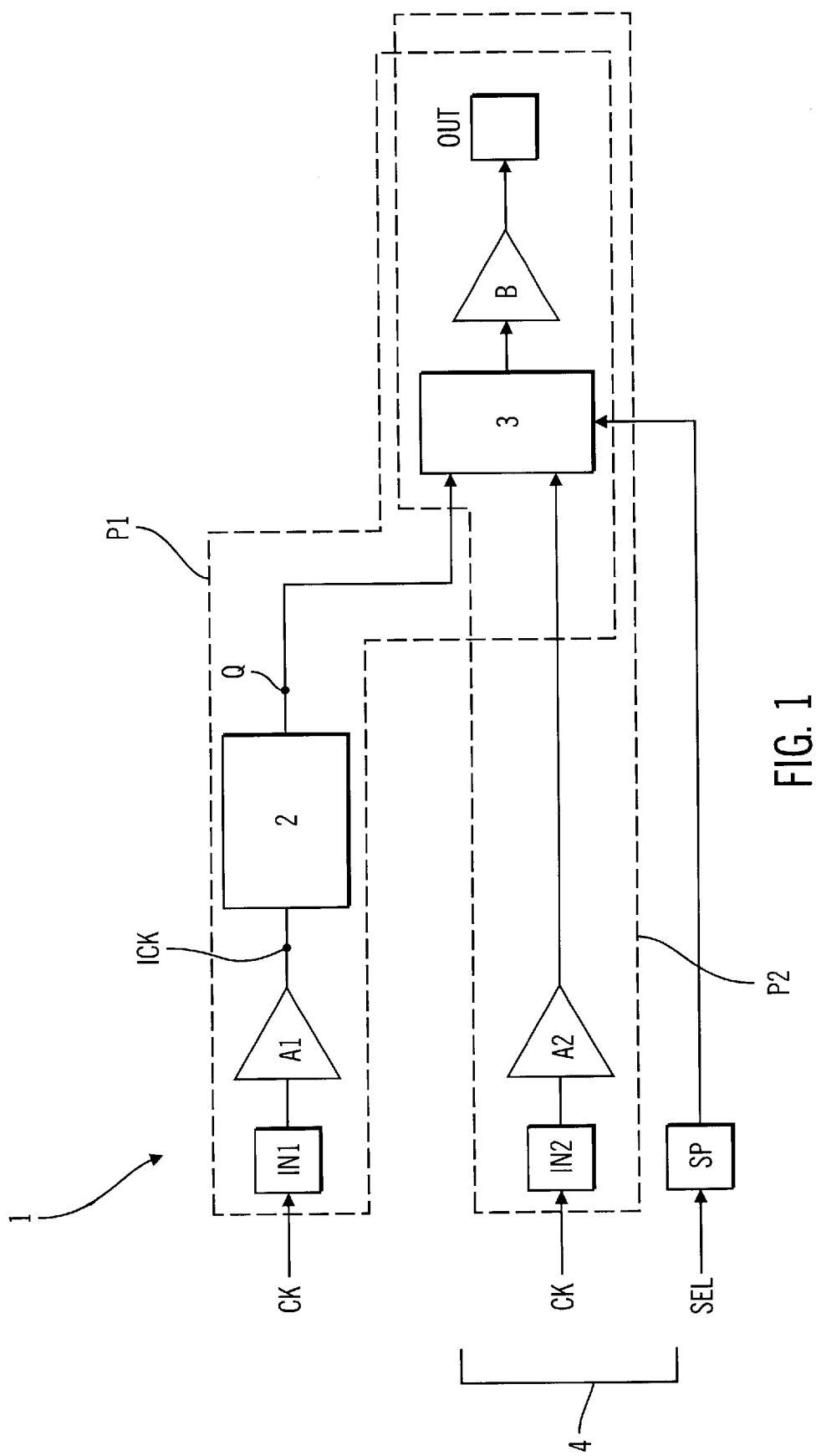
FIG. 1 shows a basic diagram of a dummy cell test circuit for measuring delay times in embedded circuits according to the present state of the art.
Figure 2:
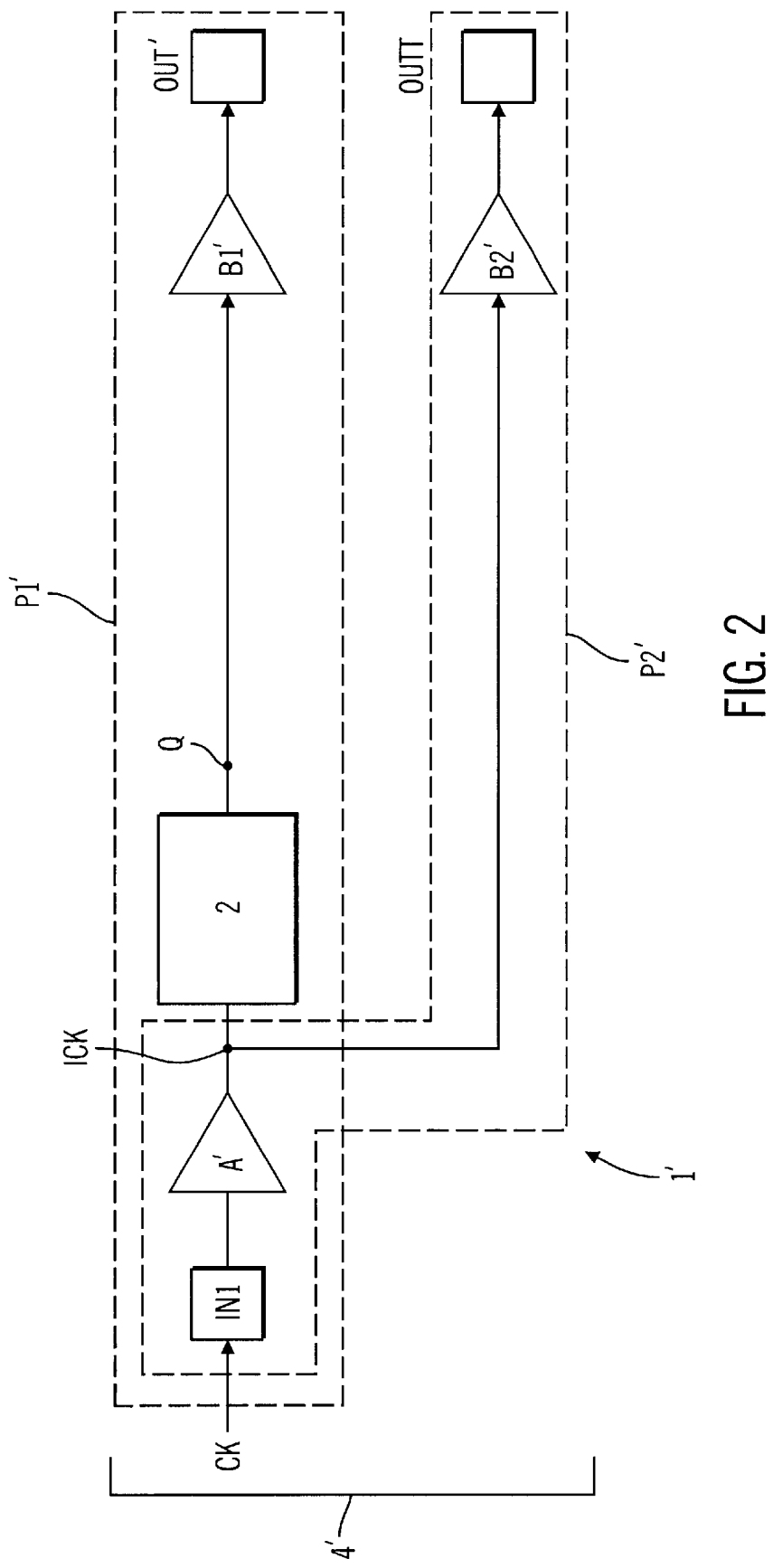
FIG. 2 shows a circuitry diagram of a dummy cell test circuit for measuring delay times in embedded circuits according to the present invention.
Figure 3:
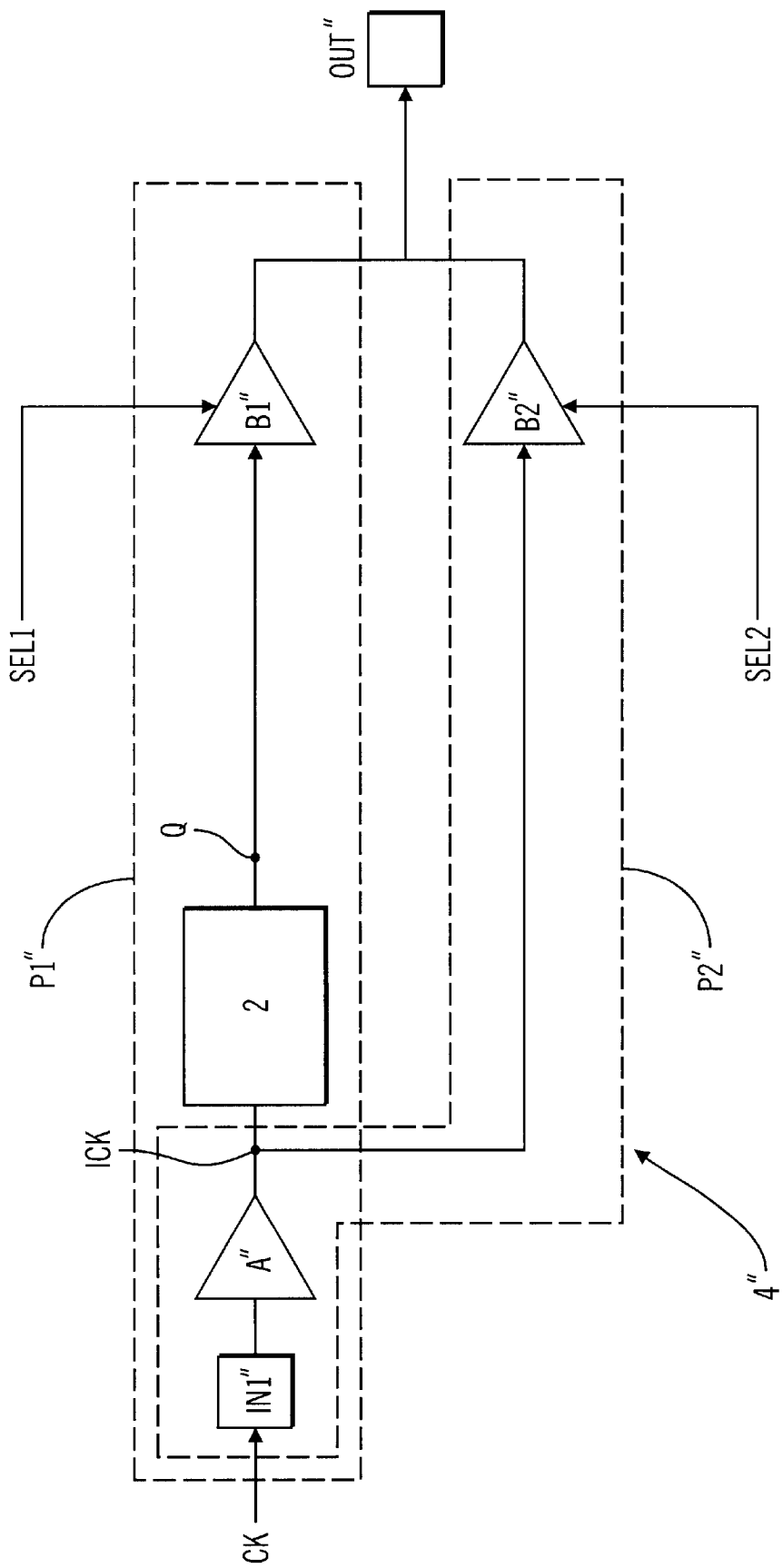
FIG. 3 shows an embodiment of the circuitry diagram of a dummy cell test circuit for measuring delay times in embedded circuits represented in FIG. 2.

FIG. 3 represents a test circuit 4", i.e. an embodiment of the test circuit 4' illustrated in FIG. 2. Said test circuit 4" has a main path P1" and a dummy path P2", both departing from an input pad IN1" and sharing an input buffer circuit A", whereas they have selectable output buffers circuits B1" and B2" instead of output buffer circuits B1' and B2' of FIG. 2. Said selectable output buffer circuits B1" and B2" have their outputs connected to one unique output pad OUT" and are controlled by a standard selection signal SEL1, which is apt to connect the main path P1" to the output pad OUT", and a test selection signal SEL2, which is apt to connect the main path P2" to the output pad OUT". Therefore, the test circuit 4" allows to use one unique output pad OUT" instead of the output pad OUT and test output pad OUTT of FIG. 2. This is especially useful in the socalled 'multi-chip' applications, i.e. where different memory banks share the same output pads and where it is both advantageous to maintain a low number of output pads and provide outputs selection means.

According to the above description the features of the present invention are clear and also its advantages are clear.

Advantageously, the dummy cell test circuit for measuring delay times in embedded circuits according to the present invention has a low dependency on the capacity effects introduced by the different interconnects. In particular, the input buffer circuit is a unique common circuit for the main path and dummy path. This involves a double advantage: first, there is no evident dissimmetry in the capacity introduced by the input buffer, secondly, the design of said input buffer circuit is unique and, for its sizing, has to keep into account the capacities downstream in parallel, i.e. those capacities introduced by the interconnects and output buffer circuits, which can anyway be maintained sufficiently similar by positioning both paths close to each other in the space.

This is obtained through a circuit of a particularly simple and cost-effective manufacture, which does not require any addition of input pads to inject test signals nor external selection signals to enable the dummy path in alternative to the main path.

Moreover, advantageously the dummy test circuit for measuring delay times in embedded circuits according to the present invention allows to measure all outputs of the embedded circuit also simultaneously, since the output pads for the memory outputs and test signal output are separated.

Finally, the dummy test circuit for measuring delay times in embedded circuits according to the present invention has a low circuitry complexity, i.e. easy circuit implementation and repetition, as well as a low cost.

It is obvious that many changes are possible for the man skilled in the art to the dummy test circuit for measuring delay times in embedded circuits according to the present invention described above by way of example, without departing from the novelty spirit of the innovative idea, and it is also clear that in practical actuation of the invention the components may often differ in form and size from the ones described and be replaced with technical equivalent elements.

The embedded circuit described above mainly refers to a typical circuitry situation of a RAM or ROM memory; however, the innovative idea can be applied to any embedded circuit where it have to be measured the propagation delays minus delays of the surrounding circuit or, anyway, the effects on the waveforms where it operates minus the effects introduced by the surrounding circuits have to be evaluated.

What is claimed is:

1. A dummy test circuit for measuring delay times in at least one embedded circuit, said embedded circuit being connected to access circuits equipped with at least one access input pad and at least one access output pad, between which is comprised an electrical main path, said dummy test circuit comprising:

a test input pad and a test output pad, between which is comprised an electrical dummy test path, wherein the embedded circuit is a circuit located on an integrated chip and arranged so as to be surrounded by further circuitry, which includes the access circuits, such that the embedded circuit is not directly accessible from any external input or external output of the integrated chip without passing through the further circuitry, and the test input pad corresponds to the access input pad for the embedded circuit.

2. A dummy test circuit according to claim 1, wherein the electrical main path and the electrical dummy test path bifurcate at an input node of the embedded circuit.

3. A dummy test circuit according to claim 2, wherein said electrical main path and said electrical dummy test path downstream the input node of the embedded circuit comprise identical circuitry with the exception of the embedded circuit itself.

4. A dummy test circuit according to claim 3, wherein said identical circuitry includes two output buffer circuits.

5. A dummy test circuit according to claim 4, wherein said two output buffer circuits have their output nodes connected to a common output pad and are selectable through selection signals.

6. A dummy test circuit according to claim 1, wherein the embedded circuit is a semiconductor memory located on the integrated chip.

7. A dummy test circuit according to claim 2, wherein said electrical main path and said electrical dummy test path upstream the input node of the embedded circuit share common circuitry.

8. A dummy test circuit according to claim 7, wherein said common circuitry includes an input buffer circuit.

9. A dummy test circuit according to claim 1,
wherein the electrical main path passes through the embedded circuit, and
the electrical dummy test path does not pass through the embedded circuit.

10. An integrated circuit chip comprising:

an embedded circuit located on the integrated circuit chip;

further circuitry located on the integrated circuit chip and connected to the embedded circuit, the further circuitry being arranged so as to surround the embedded circuit such that the embedded circuit is not directly accessible from any external input or external output of the integrated circuit chip without passing through the further circuitry, the further circuitry including an access input pad and an access output pad, between which is defined an electrical main path that passes through the embedded circuit; and a dummy test circuit located on the integrated circuit chip, the dummy test circuit including a test input pad and a test output pad, between which is defined an electrical dummy test path that does not pass through the embedded circuit, wherein the test input pad of the dummy test circuit corresponds to the access input pad of the further circuitry.

11. The integrated circuit chip according to claim 10, wherein the electrical main path and the electrical dummy test path bifurcate at an input node of the embedded circuit.

12. The integrated circuit chip according to claim 11, wherein downstream the input node of the embedded circuit, the electrical main path and the electrical dummy test path include identical circuitry with the exception of the embedded circuit itself.

13. The integrated circuit chip according to claim 12, wherein the identical circuitry includes identical output buffer circuits.

14. The integrated circuit chip according to claim 13,
wherein the output buffer circuits have their output nodes connected in common to the access output pad and are selectable through one or more selection signals, and
the access output pad of the further circuitry corresponds to the test output pad of the dummy test circuit.

15. The integrated circuit chip according to claim 10, wherein the embedded circuit is a semiconductor memory located on the integrated circuit chip.

16. The integrated circuit chip according to claim 11, wherein upstream the input node of the embedded circuit, the electrical main path and the electrical dummy test path share common circuitry.

17. The integrated circuit chip according to claim 16, wherein the common circuitry includes an input buffer circuit.

* * * * *